(12) United States Patent
Cobbley et al.

(10) Patent No.: US 8,344,514 B2
(45) Date of Patent: Jan. 1, 2013

(54) SEMICONDUCTOR DEVICE STRUCTURES AND ELECTRONIC DEVICES INCLUDING SAME HYBRID CONDUCTIVE VIAS

(75) Inventors: Chad A. Cobbley, Boise, ID (US); Jonathon G. Greenwood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/085,112

(22) Filed: Apr. 12, 2011

(65) Prior Publication Data

US 2011/0180936 A1  Jul. 28, 2011

Related U.S. Application Data

(62) Division of application No. 12/052,418, filed on Jun. 3, 2008, now Pat. No. 7,939,449.

(51) Int. Cl.
  *H01L 29/40* (2006.01)
(52) U.S. Cl. .. 257/773; 257/774; 257/786; 257/E23.175
(58) Field of Classification Search .................. 257/773, 257/774, 786, E23.175
  See application file for complete search history.

(56) References Cited

U.S. PATENT DOCUMENTS

| | | | |
|---|---|---|---|
| 6,495,454 B2 | 12/2002 | Livengood et al. | |
| 6,515,303 B2 | 2/2003 | Ring | |
| 6,599,778 B2 | 7/2003 | Pogge et al. | |
| 7,057,274 B2 | 6/2006 | Heschel | |
| 7,125,786 B2 | 10/2006 | Ring et al. | |
| 7,338,896 B2 | 3/2008 | Vanhaelemeersch et al. | |
| 7,388,277 B2 | 6/2008 | Pogge et al. | |
| 7,564,118 B2 | 7/2009 | Pogge et al. | |
| 7,576,404 B2 | 8/2009 | Wilson et al. | |
| 2002/0066960 A1 | 6/2002 | Ring | |
| 2003/0017650 A1 | 1/2003 | Armbrust et al. | |
| 2003/0111733 A1 | 6/2003 | Pogge et al. | |
| 2003/0137056 A1 | 7/2003 | Taniguchi et al. | |
| 2005/0067716 A1 | 3/2005 | Mishra et al. | |
| 2005/0121711 A1 | 6/2005 | Pogge et al. | |
| 2005/0255691 A1 | 11/2005 | Ding et al. | |
| 2006/0163740 A1 | 7/2006 | Ohno et al. | |
| 2006/0223301 A1 | 10/2006 | Vanhaelemeersch et al. | |
| 2007/0155174 A1 | 7/2007 | Taniguchi et al. | |
| 2008/0230891 A1 | 9/2008 | Pogge et al. | |
| 2009/0233438 A1 | 9/2009 | Ding et al. | |
| 2010/0155961 A1* | 6/2010 | Feyh | 257/774 |
| 2010/0176469 A1 | 7/2010 | Schmollngruber et al. | |
| 2010/0187647 A1* | 7/2010 | Bui et al. | 257/432 |
| 2010/0207274 A1* | 8/2010 | Hayashi et al. | 257/751 |
| 2011/0278690 A1* | 11/2011 | Bui et al. | 257/432 |

* cited by examiner

*Primary Examiner* — Ngan Ngo
(74) *Attorney, Agent, or Firm* — TraskBritt

(57) ABSTRACT

A conductive via of a semiconductor device includes a relatively small diameter portion extending into an active surface of a fabrication substrate and a corresponding, relatively large diameter portion that extends into a back side of the fabrication substrate. This type of conductive via may be fabricated by forming the relatively small diameter portion before or during BEOL processing, while the large diameter portion of each conductive via may be fabricated after BEOL processing is complete. Electronic devices that include one or more semiconductor devices with such conductive vias are also disclosed.

20 Claims, 7 Drawing Sheets

SEMICONDUCTOR DEVICE STRUCTURES AND ELECTRONIC DEVICES INCLUDING SAME HYBRID CONDUCTIVE VIAS

CROSS-REFERENCE TO RELATED APPLICATION

This application is a divisional of U.S. patent application Ser. No. 12/052,418, filed Jun. 3, 2008, now U.S. Pat. No. 7,939,449, issued May 10, 2011, the disclosure of which is hereby incorporated herein by this reference in its entirety.

TECHNICAL FIELD

The present invention, in various embodiments, relates generally to processes for forming conductive vias through semiconductor devices and, more specifically, to processes in which a first end of a conductive via is formed before or during electrical interconnection of active components on a first surface of a semiconductor device and a second end of the conductive via is formed after the active components have been electrically interconnected.

BACKGROUND

Conductive vias, in the form of "through-substrate vias" (TSVs) or "through-wafer interconnects" (TWIs), typically interconnect with circuitry on the front side, or active surface, of a semiconductor device and extend to a location on the opposite, back side of the semiconductor device (e.g., to contact pads, such as ball pads, pads that facilitate die-to-die interconnection, bond pads, etc.) where electrical connections with the circuitry on the active surface may be established. TSVs are useful for assembling semiconductor devices in compact stacked, or three-dimensional (3D), arrangements.

A number of existing processes have been developed to fabricate conductive vias structured as through-wafer interconnects, to route electrical signals through semiconductor devices. These processes conventionally fall into two categories, depending upon the point in which they are effected during semiconductor device fabrication. More specifically, conventional categorization of conductive via fabrication processes depends upon whether conductive vias are fabricated before or during so-called "back-end-of-the-line" (BEOL) processing or after BEOL processing. BEOL processing involves the interconnection of the active components of a semiconductor device, and includes the fabrication of dielectric layers, conductive interconnects or plugs, conductive traces or wiring, and electrodes, or contact pads, by which the semiconductor device may be externally connected with other electronic components.

Conductive vias that are fabricated before or during BEOL processing typically have diameters (or other, equivalent lateral dimensions for non-cylindrical vias) of about 3 μm to about 5 μm. With current dry etch processes, via holes having height-aspect ratios (e.g., diameter to depth) of up to about 5:1 are achievable, meaning that via holes may extend only about 25 μm into the active surface of a semiconductor substrate under fabrication. Unfortunately, with current technology, such fabrication substrates that are only 25 μm thick cannot support many types of semiconductor devices, including dynamic random access memory (DRAM) devices.

Much longer (e.g., 150 μm) conductive vias may be fabricated after BEOL processing. Such conductive vias typically have height-aspect ratios of about 3:1. As a consequence, their diameters (or other, equivalent lateral dimensions) are relatively large (e.g., about 50 μm for a 150 μm long via). Thus, such conductive vias consume an undesirably large amount of surface area, or "real estate," on the active surface of a fabrication substrate and unnecessarily limit or complicate design rules for the integrated circuitry that is to be fabricated on the active surface of a semiconductor device.

DETAILED DESCRIPTION

Figure 6:
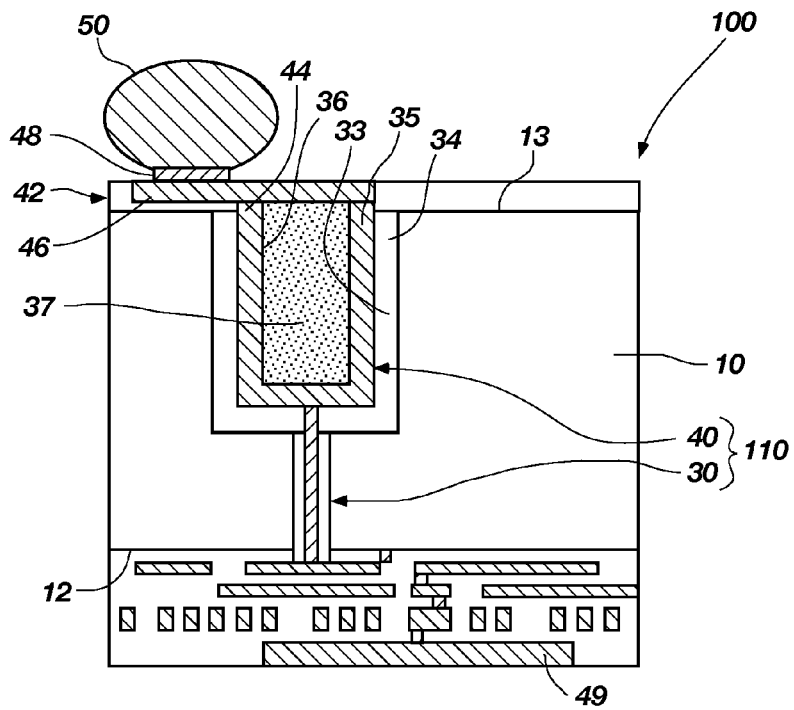
Figure 7:
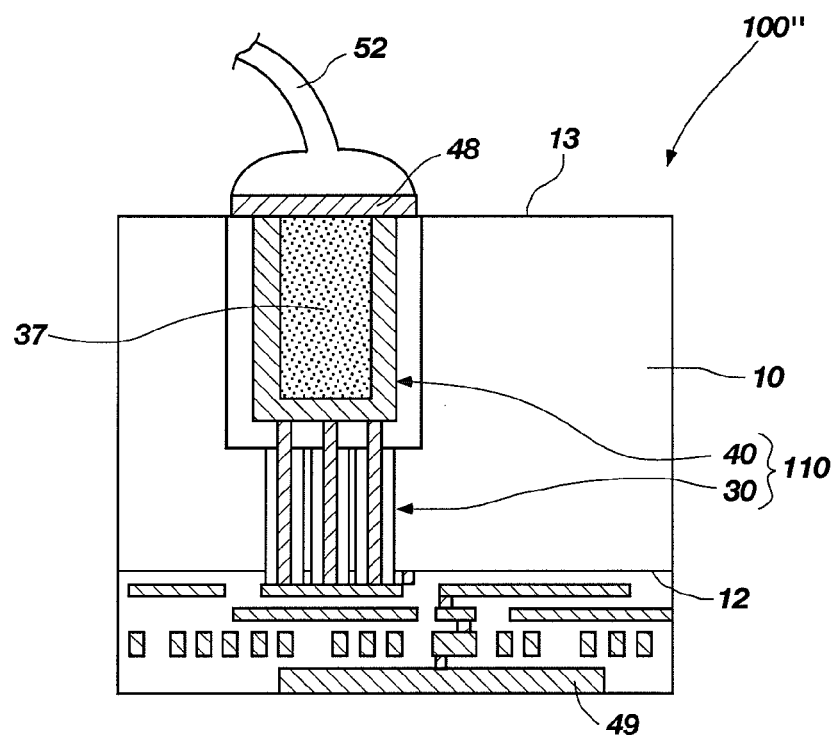
Figure 7A:
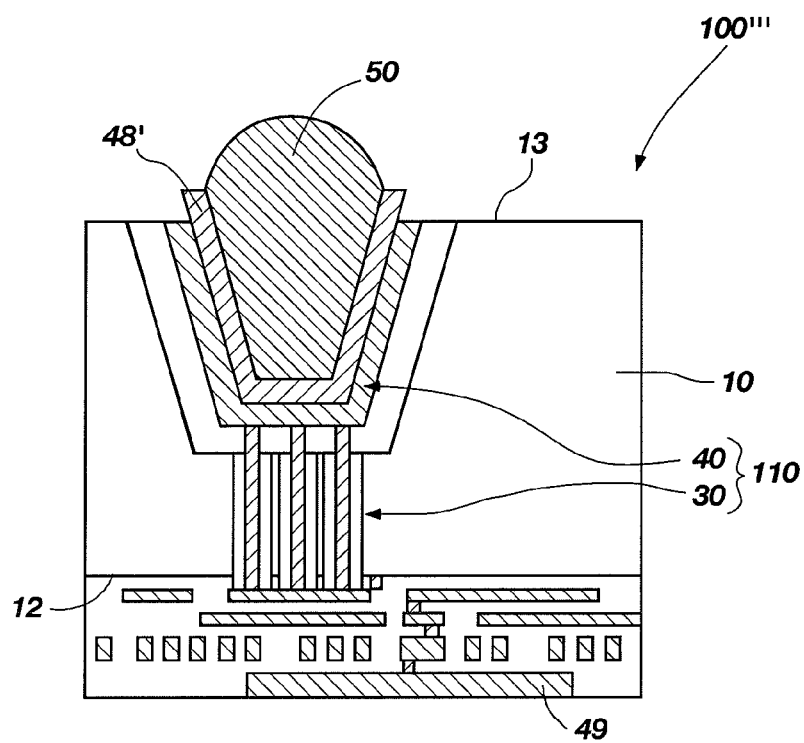

Embodiments of the present invention include methods for fabricating conductive vias that extend through a fabrication substrate with a thickness (e.g., about 6 μm, about 25 μm, about 35 μm, about 50 μm, about 100 μm, about 150 μm, etc.) that is adequate for supporting integrated circuitry fabricated on an active, or front, surface of the substrate without consuming an undesirably large amount of real estate upon the active surface of the substrate. An embodiment of such a process is described with reference to FIGS. 1 through 7A, with FIGS. 1 through 3A depicting the fabrication of one or more first conductive via ends 30 (FIGS. 3 and 3A) and FIGS. 5 through 7A illustrating the fabrication of one or more second conductive via ends 40 (FIGS. 6 and 7A).

Figure 1:
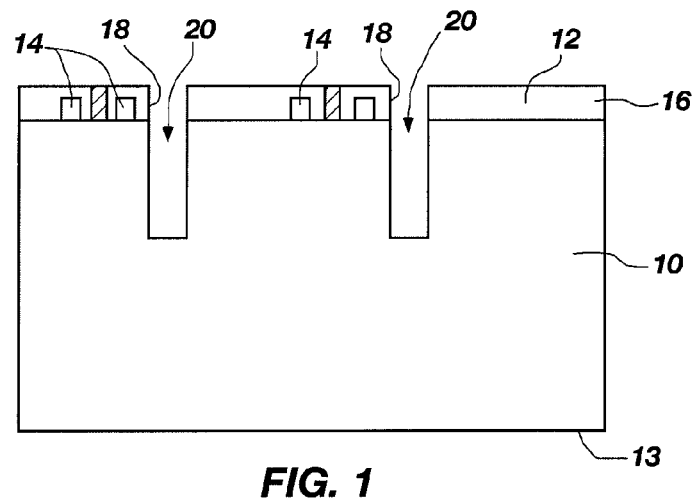
FIGS. 1 through 3A depict embodiments of processes for forming first ends of conductive vias in an active surface of a fabrication substrate before and during BEOL processing.

In FIG. 1, a schematic representation of a fabrication substrate 10 comprising a semiconductor material and including an active surface 12, which carries a plurality of active components 14 (e.g., transistors, resistors, etc.) is provided. The first end of at least one via hole, or "first via hole" 20, which is laterally offset from active components 14, is formed in active surface 12. Without limiting the scope of the present invention, known wet etch processes or dry etch processes (e.g., reactive ion etch, or RIE) may be used in conjunction with a mask (e.g., a photomask) to remove material from active surface 12 of fabrication substrate 10. Alternatively, laser ablation processes may be used to form one or more first via holes 20. Each first via hole 20 is the result of such material removal. In some embodiments, the distance across (e.g., diameter of) each first via hole 20 may be about 3 μm to about 6 μm. In embodiments where each first via hole 20 has a height-aspect ratio of about 5:1, the depth of each first via hole 20 may be about 15 μm to about 30 μm.

The present invention includes embodiments in which first via holes 20 and some of the other features of conductive vias are fabricated before or during (e.g., as part of, concurrently, with, etc.) BEOL processing, in which conductive elements (e.g., contact plugs, conductive traces, contact pads, etc.) that interconnect active components 14 are fabricated. In such embodiments, first via holes 20 may communicate with apertures 18 that have been formed, by known techniques, through a dielectric film 16 (e.g., a borophosphosilicate glass (BPSG) film, a phosphosilicate glass (PSG) film, etc.).

Figure 2:
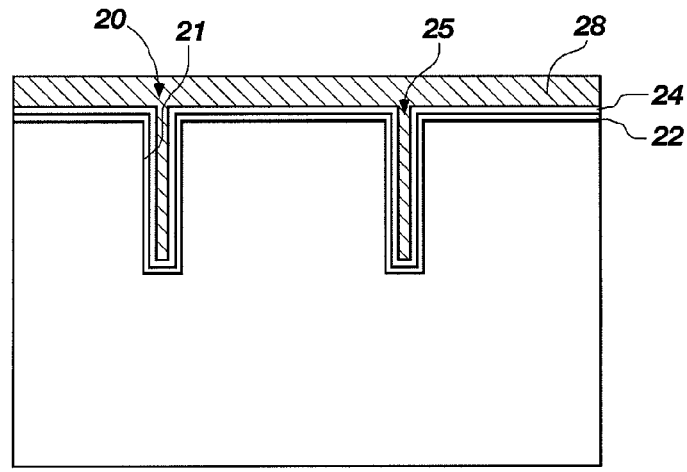

FIG. 2 depicts the fabrication of one or more dielectric layers 22 and, optionally, barrier layers 24 on surfaces 21 of each first via hole 20. A dielectric layer 22 may be grown on (e.g., undoped silicon dioxide, etc.), deposited onto (e.g., a low-K dielectric material, a silicon nitride, a silicon oxynitride, etc.), or otherwise applied to surfaces 21. In some embodiments, one or more barrier layers 24 (e.g., copper barriers, aluminum barriers, etc.) may be fabricated over a dielectric layer 22 by known, suitable deposition techniques, such as chemical vapor deposition (CVD), including pulsed chemical vapor deposition (PCVD) and atomic layer deposition (ALD); physical vapor deposition (PVD) (e.g., sputtering); or other conductive film-forming techniques.

Dielectric layer 22 and all of its associated layers (e.g., barrier layer 24) have a combined film thickness that is less than half the distance (e.g., radius) across each first via hole 20 in order to leave an opening 25 for the receipt of conductive material within each first via hole 20.

In embodiments where one or more first conductive via ends 30 (FIGS. 3 and 3A) are fabricated before BEOL processing, dielectric layers 22, and any optional layers associated therewith, including barrier layer 24, may remain over active surface 12 of fabrication substrate 10 until after conductive material has been introduced into opening 25 (FIG. 2) within each first via hole 20 (FIG. 1), as shown in FIG. 2.

Figure 2A:
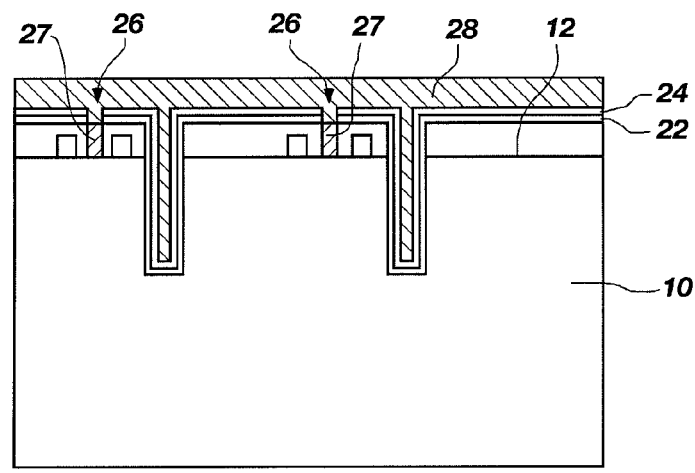

The formation of each dielectric layer 22 and barrier layer 24, if any, may be effected as part of, or concurrently with, BEOL processing, in which corresponding dielectric films and optional barriers for conductive interconnects and/or conductive traces are formed. In the event that dielectric layer 22, any barrier layer 24, and any other associated layers are deposited as part of BEOL processing one or more of these layers may, if desired, be patterned by known techniques. Such patterning techniques may include, but are not limited to, mask and etch processes, in which dielectric layer 22 and/or dielectric film 16, as well as any associated adhesion or barrier layers, may be patterned to form apertures 26 (e.g., contact apertures) that expose underlying structures 27 (e.g., active-device, or conductivity doped, regions, conductive structures, etc.), as shown in FIG. 2A. The exposure of underlying structures 27 enables subsequent electrical connection with the underlying structures 27.

Figure 2B:
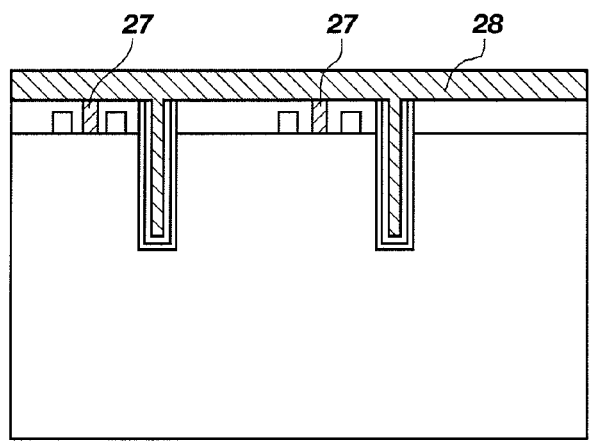

In other embodiments, dielectric layer 22 and barrier layer 24, if any, as well as any associated adhesion layers, may be polished or planarized (e.g., by chemical-mechanical polishing or planarization (CMP)), as shown in FIG. 2B.

After dielectric layer 22 and any other optional layers have been formed, conductive material 28, such as aluminum, copper, or any other suitable TSV material, may be introduced into the remainder (i.e., within opening 25 (FIG. 2)) of each first via hole 20, as illustrated by FIGS. 2 through 2B. Known techniques may be used to introduce conductive material 28 into each first via hole 20 and over other locations of fabrication substrate 10, including, in various non-limiting embodiments, CVD and PVD processes. In embodiments where such processing is being conducted as part of BEOL processing, as depicted in FIGS. 2A and 2B, conductive material 28 may also be introduced into contact with any previously fabricated structures 27 (e.g., active-device, or conductivity doped, regions, conductive structures, etc.).

Figure 3:
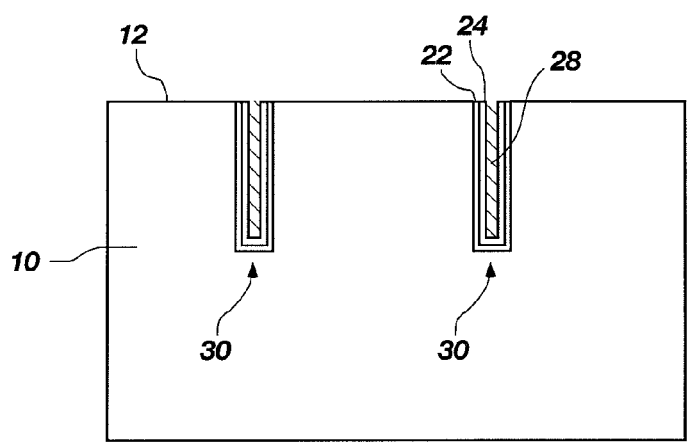
Figure 3A:
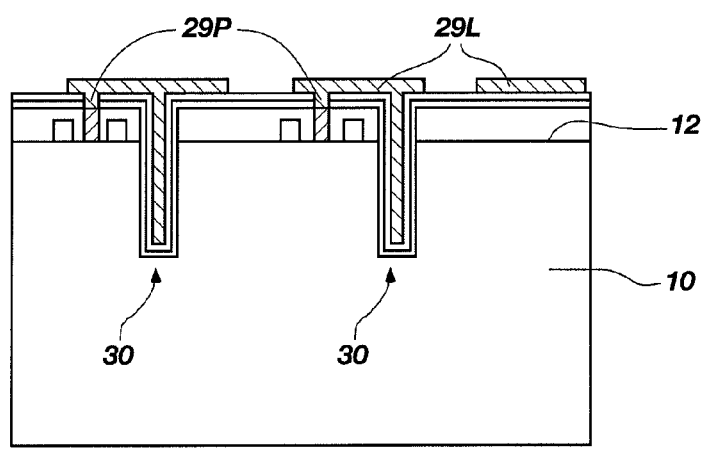

As FIG. 3 illustrates, in embodiments where first conductive via end 30 processing is conducted before BEOL processing, conductive material 28, as well as any layers (e.g., dielectric layer 22, barrier layer 24, etc.) located between conductive material 28 and active surface 12 of fabrication substrate 10, may be completely removed from above active surface 12 of fabrication substrate 10 by known techniques, including, without limitation, polishing or planarization processes. When first conductive via end 30 processing and BEOL processing are concurrently effected, as shown in FIGS. 2A and 2B, known techniques may be used to pattern conductive structures, such as the depicted conductive plugs 29P and conductive lines 29L, from conductive material 28 (FIGS. 2A and 2B) located over active surface 12 of fabrication substrate 10. One or more first conductive via ends 30 result from the processes shown in FIGS. 3 and 3A.

Figure 4:
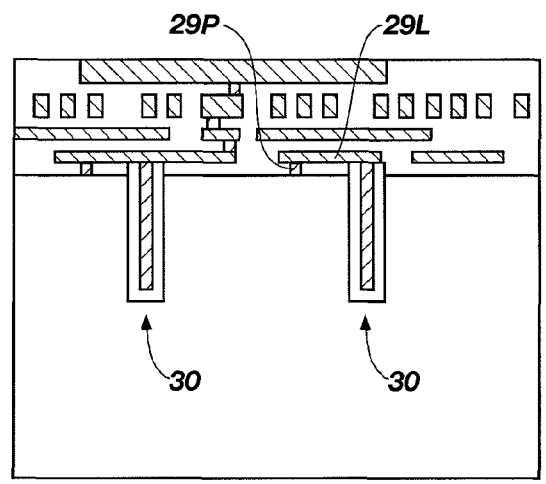
FIG. 4 shows an embodiment of a semiconductor device that includes at least one first end of a conductive via and that has been subjected to BEOL processing.

Once first conductive via end 30 has been fabricated, BEOL processing may be completed, as known in the art and shown in FIG. 4.

Once the fabrication of integrated circuitry and protective layers therefor over active surface 12 has been completed, the thickness of fabrication substrate 10 may be reduced (i.e., fabrication substrate 10 may be thinned) by removing material from its back side 13. Material may be removed from back side 13 by known techniques, such as back grinding processes, with a wet etchant, or as otherwise known in the art. The thickness of fabrication substrate 10 may, in some embodiments, be reduced from an initial thickness of about 700 μm to about 800 μm to a finished thickness, not including the thickness of any structures fabricated on or overlying active surface 12, of about 150 μm or less (e.g., 120 μm, 100 μm, etc.). The resulting structure is shown, in inverted orientation, in FIG. 5.

Figure 5:
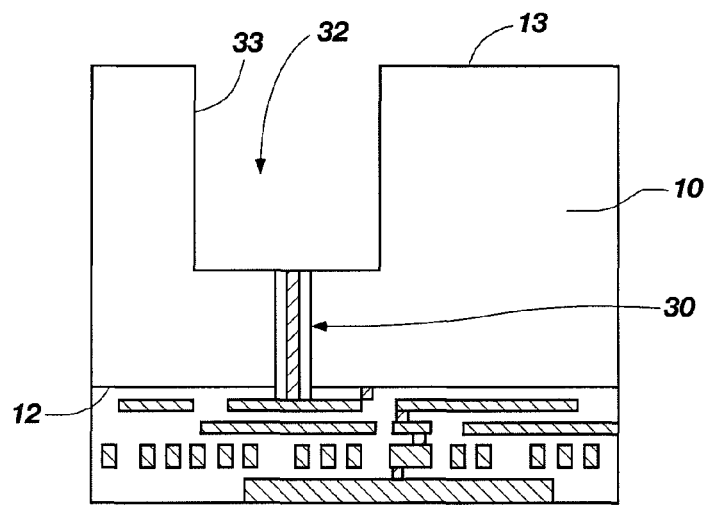
FIGS. 5 through 7A illustrate embodiments of processes for forming second ends of conductive vias in a back side of a substrate of a semiconductor device.

With continuing reference to FIG. 5, processing continues to the fabrication of a second conductive via end 40 (FIGS. 6 through 6B) from back side 13 of fabrication substrate 10.

Figure 5A:
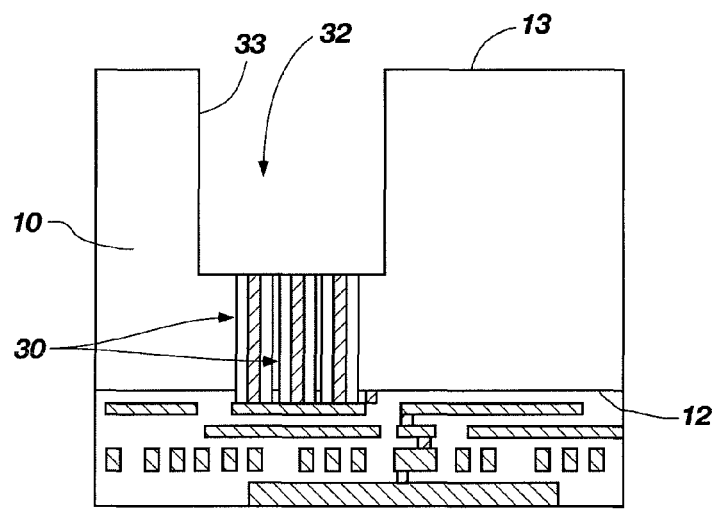

Initially, one or more second via holes 32 are formed in back side 13. Each second via hole 32 may be formed at a location to enable communication with a single corresponding first conductive via end 30, as shown in FIG. 5, or with a plurality of corresponding first conductive via ends 30, as illustrated in FIG. 5A. The latter embodiment is particularly useful, among other possible purposes, for delivering power to integrated circuitry carried by active surface 12 through an electrode at back side 13. The connection of a single second conductive via end 40 to a plurality of first conductive via ends 30 may reduce the number of contact pads (e.g., ball pads, pads that facilitate die-to-die interconnection, bond pads, etc.) that are required for a particular purpose (e.g., power delivery), which may enable a reduction in the overall sizes of semiconductor devices that incorporate this feature.

One or more second via holes 32, to each of which one or more first conductive via ends 30 are exposed, may be formed in back side 13 by any suitable technique known in the art. In some embodiments, each second via hole 32 may be formed by laser ablation. In other embodiments, known mask (e.g., photomask) and etch (e.g., wet etch, dry etch, etc.) processes may be used to form one or more second via holes 32 at desired locations through back side 13 of fabrication substrate 10. Without limiting the scope of the present invention, in various embodiments, each resulting second via hole 32 may have a height-aspect ratio as small as about 3:1 or even as small as about 2:1. In more specific embodiments, the distance across (e.g., diameter of) a second via hole 32 that extends about 80 μm to about 90 μm into back side 13 of fabrication substrate 10 may be about 50 μm. As the distance across (e.g., diameter of) each second via hole 32 may be much larger than the corresponding distance across the corresponding first via hole 20 (or via holes 20) within which the corresponding first conductive via end 30 is located, the likelihood that a second via hole 32 will be misaligned with its corresponding first via hole 20 (or via holes 20) is significantly reduced.

Figure 6A:
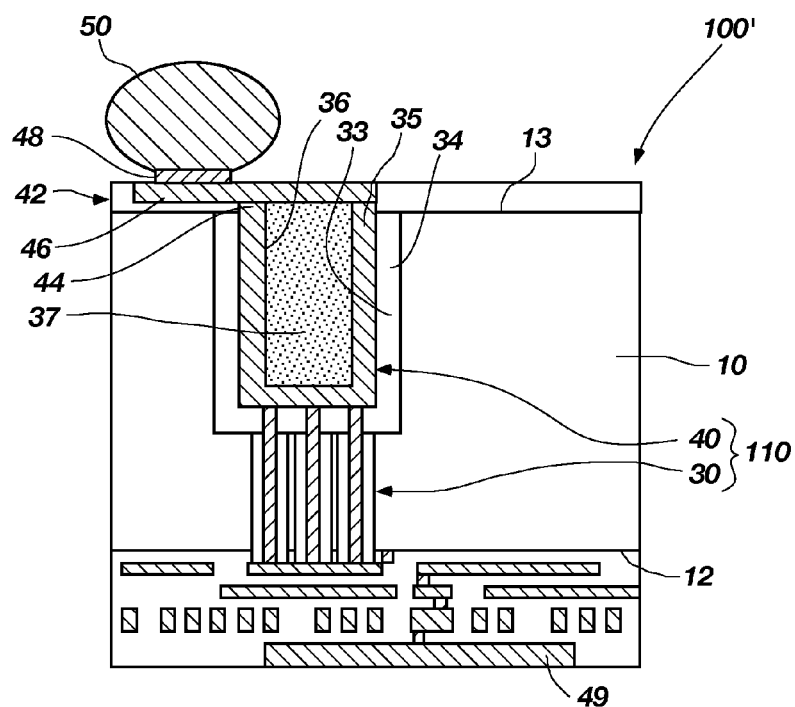
Figure 6B:
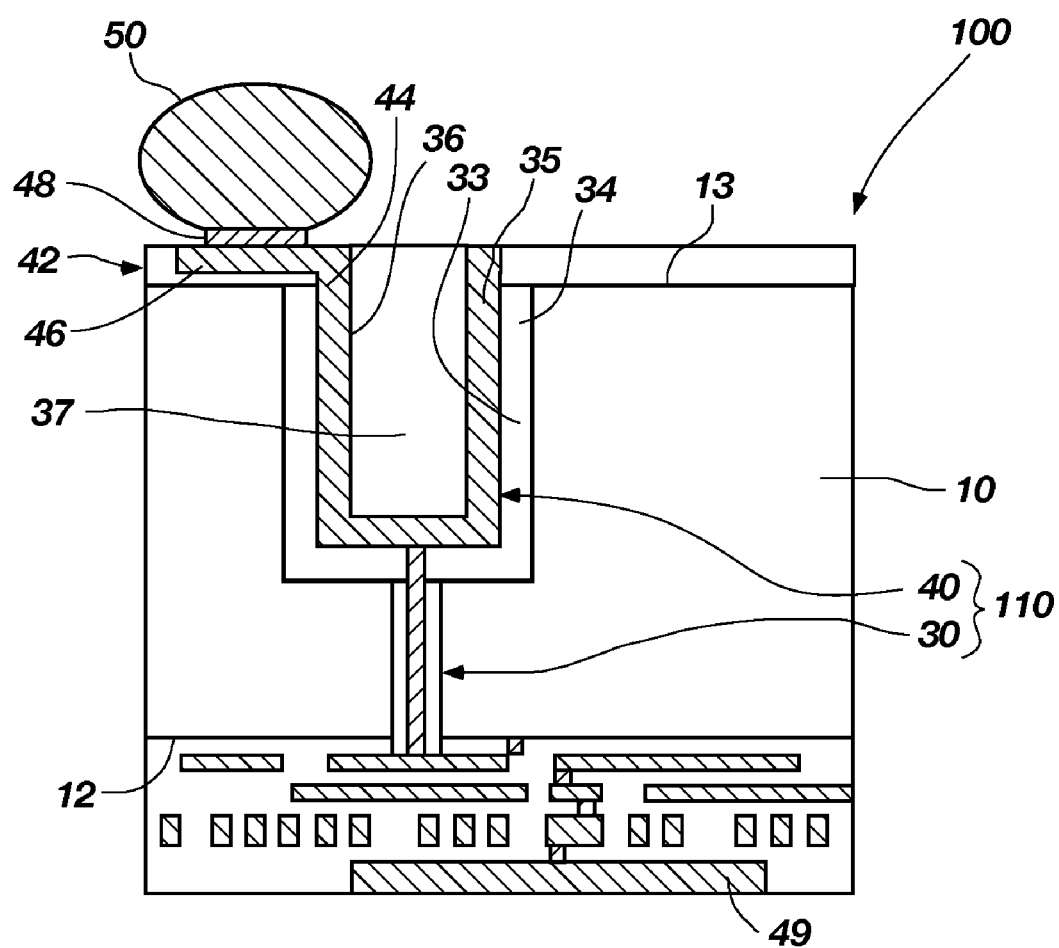

After each second via hole 32 is formed, its surfaces 33 may be coated with one or more material layers, as shown in FIGS. 6 through 6B. Included among these material layers are one or more dielectric layers 34. A dielectric layer 34 may be grown on (e.g., undoped silicon dioxide, etc.), deposited onto (e.g., a low-K dielectric material, a silicon nitride, a silicon oxynitride, etc.), or otherwise applied to surfaces 33. In some embodiments, one or more barrier layers 35 (e.g., copper barriers, aluminum barriers, etc.) may be fabricated over a dielectric layer 34 by known, suitable deposition techniques, such as CVD, PVD, or other conductive film-forming techniques. In some embodiments, one or more optional adhesion layers that may enable the use of one or more desired types of dielectric and/or barrier materials may also be fabricated over surfaces 33 of each second via hole 32.

With continued reference to FIGS. 6 through 6B, conductive material 37 may be introduced into each second via hole 32. As conductive material 37 is introduced into each second via hole 32, conductive material 37 may, in some embodiments, also be introduced over back side 13 of fabrication substrate 10. In other embodiments, a coating of conductive material may be formed over at least portions of back side 13 of fabrication substrate 10 (e.g., over material within each second via hole 32) at a later point during the processing of fabrication substrate 10, as in the embodiment shown in FIG. 6B.

In some embodiments, conductive material 37 may be introduced into each second via hole 32 in a manner that completely or substantially fills the opening that remains within second via hole 32 after dielectric layer 34, and barrier layer 35, and any other optional layer or layers, such as a plating seed layer, have been formed. In other embodiments, conductive material 37 may merely line or coat surfaces of the opening 36 that remains within each second via hole 32. The degree to which conductive material 37 fills each opening 36 depends, at least in part, upon the conductive material introduction technique that is employed.

A variety of known techniques may be used to introduce conductive material 37 into the opening 36 remaining within each second via hole 32. Such conductive material introduction processes include, but are not limited to, plating processes (e.g., electroless plating, immersion plating, electrolytic plating, etc.), CVD, PVD, forcing a conductive paste (e.g., a metal paste, a solder paste, a paste or another solder alloy, etc.) into each opening, then reflowing the conductive paste, introducing a molten conductive material (e.g., a molten metal, a molten solder, another molten alloy, etc.) into each opening, then allowing the same to solidify, introducing a flowable conductive or conductor-filled polymer into each opening, then curing or otherwise causing or alloying the same to solidify, and any other suitable technique for introducing conductive material 37 into a blind ended via hole. Upon introducing conductive material 37 into each opening 36, a second conductive via end 40 is formed. In some embodiments, a conductive layer 42 may also be formed over back side 13 of fabrication substrate 10.

Any space remaining within a second via hole 32 following the introduction of conductive material 37 into opening 36 may remain open (see FIG. 6B) or be completely or partially filled with another material (e.g., additional conductive material, an electrically insulative material, a thermally conductive material, etc.) (see FIGS. 6 and 6A).

With continued reference to FIGS. 6 through 6B, in some embodiments, any conductive layers 37 (as well as any underlying barrier layer 35, etc.) and, possibly, any underlying layers (e.g., dielectric layer 34, etc.) that extend across back side 13 of fabrication substrate 10 may be removed or patterned by known techniques. Suitable removal processes include, without limitation, CMP and wet etch processes, resulting in semiconductor devices such as the embodiments shown in FIGS. 7 and 7A. Patterning techniques include, but are not limited to, mask and etch processes, resulting, in some embodiments, in a semiconductor device that includes conductive features, such as conductive traces 44 and electrodes 46 on back side 13, as are present in the embodiments that are depicted in FIGS. 6 through 6B.

If desired, under-bump metallization (UBM), or ball-limiting metallurgy (BLM), may be formed on each second conductive via end 40 (FIG. 7) or a corresponding electrode 46 (FIGS. 6 through 6B) by known techniques.

In the embodiments shown in FIGS. 6, 6A, 6B, and 7, the UBM, or BLM, may form one or more contact pads 48, which are also referred to herein as "bottom contact pads," over back side 13 of fabrication substrate 10. Each contact pad 48 facilitates the electrical connection of a discrete conductive element 50 (FIGS. 6 through 6B) or a laterally extending intermediate conductive element 52 (FIG. 7) to a corresponding second conductive via end 40 (FIG. 7) or electrode 46 (e.g., the formation of discrete conductive element 50 on contact pad 48, the securing of discrete conductive element 50 or a laterally extending intermediate conductive element 52 to contact pad 48, etc.) (FIGS. 6 through 6B).

In other embodiments, such as that shown in FIG. 7A, the UBM, or BLM, may be formed over conductive material 37 that lines the surfaces of one or more openings 36 in back side 13 to provide an adhesion layer 48' thereover. Adhesion layer 48' adheres to a discrete conductive element 50 that has been introduced to that opening and establishes electrical communication between discrete conductive element 50 and conductive material 37.

Without limiting the scope of the present invention, each discrete conductive element 50 may comprise a ball, bump, pillar, stud, column, pin or other structure formed from a suitable conductive material, such as solder, another metal or metal alloy, a conductive or conductor-filled polymer, or the like. Intermediate conductive elements 52 include, but are not limited to, bond wires, leads (including leads-over-chip (LOC) type leads, conductive elements that are carried by flexible dielectric materials, as in tape-automated bonding (TAB) type arrangements, thermocompression leads, etc.), and the like.

Discrete conductive elements 50 and/or intermediate conductive elements 52, which may be secured to bottom contact pads 48, adhesion layer 48', or top contact pads 49, may electrically connect a semiconductor device 100, 100', 100", 100"' (FIGS. 6 through 7A, respectively) according to the present invention to another electronic component, such as a carrier substrate (e.g., a circuit board, interposer, flexible substrate, etc.) leads, or another semiconductor device.

A semiconductor device 100, 100', 100", 100"' that has been fabricated in accordance with one or more embodiments of the present invention includes a fabrication substrate 10 with a thickness (e.g., about 100 µm to about 150 µm) that provides adequate structural support for integrated circuitry that has been fabricated on active surface 12. Conductive via ends 30/40 of semiconductor device 100, 100', 100", 100"' enable the use of contact pads 48, 49 and intermediate conductive elements 50, 52 on back side 13 to communicate electrically with integrated circuitry carried by active surface 12 without occupying valuable area, or real estate, upon active surface 12 and, thus, without decreasing the optimal density of integrated circuitry on active surface 12.

In some embodiments, all contact pads 48 of a semiconductor device 100, 100', 100", 100"' may be carried by back side 13 of fabrication substrate 10. In embodiments where all of the contact pads 48 of a semiconductor device 100, 100', 100", 100''' are located on back side 13 of fabrication substrate 10, there is no need to locate them over "dead" areas of the active surface, which frees up additional area, or real estate, on active surface 12 for integrated circuitry and increases the number of available circuit designs.

In other embodiments, a top contact pad 49 may be located over active surface 12 of fabrication substrate 10, while another, corresponding bottom contact pad 48, which communicates with the same circuitry as the top contact pad 49, is carried by back side 13. Testing or burn-in may be effected through only the top contact pads 49 or through only the bottom contact pads 48, preserving the other set of contact pads for use in connecting semiconductor device 100, 100', 100", 100''' to other electronic components, such as leads, a circuit board, or the like.

Furthermore, with contact pads 48 positioned on back side 13, the contact pads 48 are also separated from the integrated circuitry on active surface 12 by the thickness of fabrication substrate 10 rather than by much thinner dielectric layers that would otherwise separate contact pads located over active surface 12 from the integrated circuitry. As a result, there may be reduced potential for damaging the integrated circuitry as pressure is applied to contact pads 48 that are carried by back side 13, as may occur during test and/or burn-in processes, in which probe elements are forced against contact pads.

A number of other advantages of various embodiments of the present invention will also be apparent to those of ordinary skill in the art. In comparison to conventional through-wafer processes, in which relatively large diameter vias are formed through a substrate, these advantages may include, but are not limited to, minimized contamination and physical distancing of interconnect processing from semiconductor device circuitry and, thus, minimization or elimination of damage to circuitry (and to the semiconductor substrate) and of conductive via-induced stress on nearby circuitry of the semiconductor device. Moreover, stresses that are induced on a substrate by rows of vias that extend completely through the semiconductor device and stresses resulting from mismatches in the coefficients of thermal expansion (CTEs) of a substrate and the material or materials of conductive vias extending entirely through the substrate may be reduced with the use of large diameter vias that extend only partially through a substrate. The elimination of at least some relatively large diameter conductive vias from the region of circuitry that is carried by the active surface of a semiconductor substrate may also relax design rules and/or enable improvements in the density with which such circuits are arranged. Further, large diameter conductive vias that extend only partially through a substrate may be formed more quickly and, due to their lower aspect ratios, receive conductive material more quickly and reliably than conductive vias of comparable diameter that extend completely through a semiconductor device. Additionally, the inclusion of large diameter conductive vias at the back side of a semiconductor device may enable the use of standard assembly equipment to form redistribution circuitry on the back side, which, due to the limited ability of such equipment to recognize smaller diameter, densely arranged conductive vias, would not otherwise be possible with small diameter conductive vias. Any of these contemplated advantages may lead to improved industrial scalability, product yields, and reliability when compared with the industrial scalability, product yields, and reliability that may be achieved when conventional processes are used to form conductive vias completely through semiconductor devices.

Figure 8:
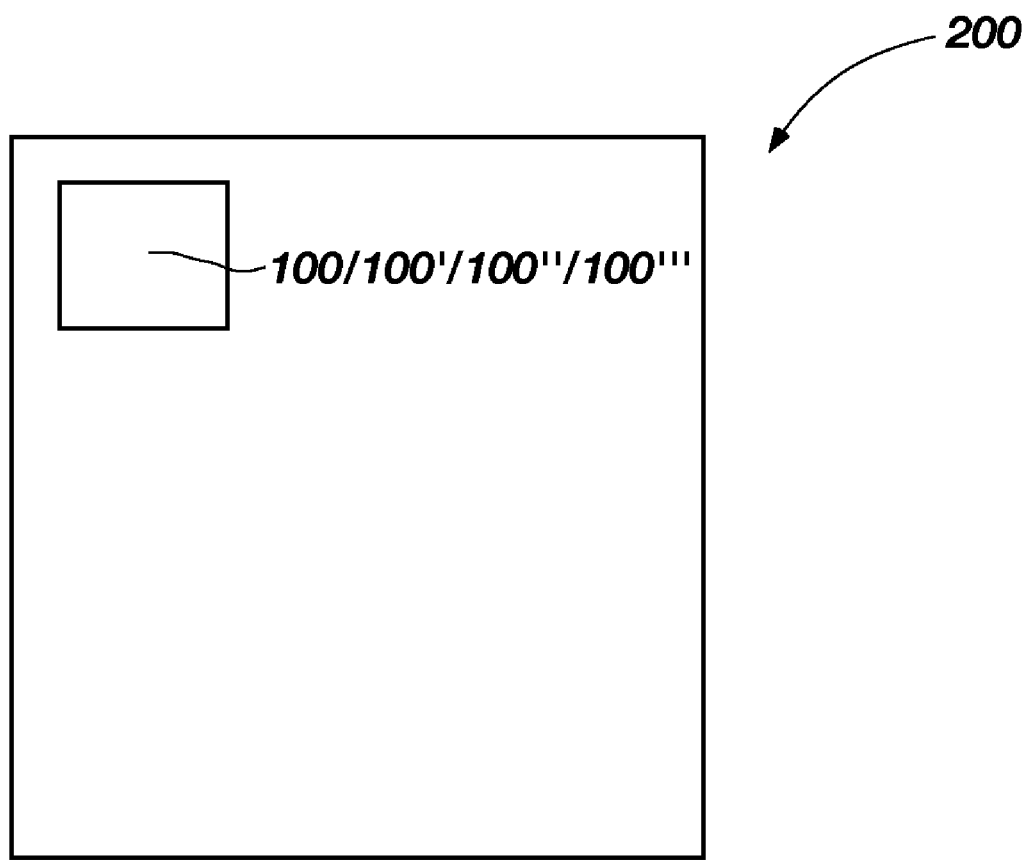
FIG. 8 schematically depicts an electronic device including a semiconductor device with at least one via according to an embodiment of the present invention.

Turning now to FIG. 8, an electronic device 200, such as a computer, controller, cellular telephone, portable digital music player, digital camera, or the like, that includes at least one semiconductor device 100, 100', 100", 100''' including one or more vias 110 (see FIGS. 6-7B) according to embodiments of the present invention is depicted.

In summary, the present invention includes semiconductor devices with one or more conductive vias that include a relatively small diameter portion extending into an active surface of a fabrication substrate and a corresponding, relatively large diameter portion that extends into a back side of the fabrication substrate. In some embodiments, this type of conductive via may be fabricated by for ruing the relatively small diameter portion before or during BEOL processing, while the large diameter portion of each conductive via may be fabricated after BEOL processing is complete. Electronic devices that include one or more semiconductor devices with such conductive vias are also disclosed.

Although the foregoing description contains many specifics, these should not be construed as limiting the scope of the present invention, but merely as providing illustrations of some embodiments. Similarly, other embodiments of the invention may be devised which lie within the scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein, which fall within the meaning and scope of the claims, are to be embraced thereby.

What is claimed:

1. A semiconductor device structure, comprising:
   a substrate comprising a semiconductor material and including:
   an active surface carrying active components; and
   a back side;
   at least one via hole, including:
   at least one first end having an aspect ratio of about 5:1 or less extending from the active surface into the semiconductor material; and
   a second end aligned and in communication with the at least one first end and extending from the back side into the semiconductor material, the second end having a larger lateral dimension than the at least one first end and an aspect ratio less than the aspect ratio of the at least one first end and no more than about 3:1; and
   at least one of interconnection circuitry and at least one insulation layer for interconnection circuitry positioned above the at least one first end of the at least one via hole.

2. The semiconductor device structure of claim 1, wherein the at least one first end has a diameter of at most about 6 μm.

3. The semiconductor device structure of claim 2, wherein the at least one first end extends at most about 30 μm into the semiconductor material of the substrate.

4. The semiconductor device structure of claim 1, wherein the second end has a diameter of at most about 50 μm.

5. The semiconductor device structure of claim 4, wherein the second end extends at most about 150 μm from the back side into the semiconductor material of the substrate.

6. The semiconductor device structure of claim 1, further comprising:
   at least one conductive element extending through the at least one via hole.

7. The semiconductor device structure of claim 6, comprising interconnection circuitry and wherein at least a first end of the at least one conductive element, within at least the at least one first end of the at least one via hole, is integral with the interconnection circuitry.

8. The semiconductor device structure of claim 6, wherein at least an end of the at least one conductive element within or adjacent to the second end of the at least one via hole comprises solder.

9. An electronic device, comprising:
at least one semiconductor device including:
a substrate having an active surface and a back side;
at least one via hole, including:
at least one first end and a second end;
the at least one first end having an aspect ratio of no more than about 5:1, extending from the active surface into the substrate;
the second end extending from the back side in communication and aligned with the at least one first end, the second end having a larger lateral dimension than the at least one first end and an aspect ratio less than the aspect ratio of the at least one first end and no more than about 3:1; and
at least one of interconnection circuitry and at least one insulation layer for interconnection circuitry located over the at least one first end of the at least one via hole.

10. The electronic device of claim 9, wherein the at least one first end has a diameter of between about 3 μm and about 6 μm.

11. The electronic device of claim 10, wherein the at least one first end extends at most about 30 μm into the semiconductor material of the substrate.

12. The electronic device of claim 9, wherein the second end has a diameter of no more than about 50 μm.

13. The electronic device of claim 12, wherein the second end extends no more than about 150 μm from the back side into the semiconductor material of the substrate.

14. The electronic device of claim 9, further comprising:
at least one conductive element extending through the at least one via hole.

15. The electronic device of claim 14, comprising interconnection circuitry and wherein at least a first end of the at least one conductive element, within at least the at least one first end of the at least one via hole, is integral with the interconnection circuitry.

16. The electronic device of claim 14, wherein at least an end of the at least one conductive element within or adjacent to the second end of the at least one via hole comprises solder.

17. The electronic device of claim 9, wherein the second end of the at least one via hole is filled with a conductive material.

18. The electronic device of claim 14, further comprising a discrete conductive element protruding from the back side of the substrate connected to the at least one conductive element.

19. The semiconductor device structure of claim 1, wherein the second end of the at least one via hole is filled with a conductive material.

20. The semiconductor device structure of claim 6, further comprising a discrete conductive element protruding from the back side of the substrate connected to the at least one conductive element.

* * * * *